United States Patent [19]

Peterson, Jr.

[11] Patent Number: 4,839,581

[45] Date of Patent: Jun. 13, 1989

[54] ABSOLUTE ELECTRICAL POTENTIAL MEASURING APPARATUS AND METHOD

[76] Inventor: Thomas F. Peterson, Jr., 3060 Lander Rd., Pepper Pike, Ohio 44124

[21] Appl. No.: 930,815

[22] Filed: Nov. 13, 1986

[51] Int. Cl.[4] .......................................... G01R 31/02
[52] U.S. Cl. .................................. 324/72; 324/450; 324/72.5
[58] Field of Search .............. 324/64, 446, 447, 450, 324/72, 72.5, 96

[56] References Cited

U.S. PATENT DOCUMENTS

| | | | |
|---|---|---|---|
| 1,446,748 | 2/1923 | Johnsen et al. | |
| 1,611,716 | 12/1926 | Brown. | |
| 1,716,700 | 6/1929 | Kleeman. | |
| 1,938,136 | 12/1933 | Crew | 175/183 |
| 1,974,483 | 9/1934 | Brown. | |
| 2,141,590 | 12/1938 | Blondeau | 175/182 |
| 2,206,863 | 7/1940 | Cloud | 175/182 |
| 2,210,795 | 8/1940 | Cloud | 175/182 |
| 2,344,672 | 3/1944 | Blasier | 175/183 |
| 2,449,068 | 9/1948 | Gunn | 171/95 |
| 2,482,773 | 9/1949 | Hieronymus | 250/83 |
| 2,587,156 | 2/1952 | Havenhill et al. | 171/95 |
| 2,659,863 | 11/1953 | Stanton | 324/99 |
| 2,721,975 | 10/1955 | Wojciechowski | 324/61 |
| 2,820,947 | 1/1958 | Gunn | 324/72 |
| 2,862,177 | 11/1958 | Titterington | 324/29 |
| 2,931,221 | 4/1960 | Rusk | 73/179 |
| 2,949,550 | 8/1960 | Brown | 310/5 |
| 2,993,165 | 7/1961 | Jauch | 324/32 |
| 3,018,394 | 1/1962 | Brown | 310/5 |
| 3,022,430 | 2/1962 | Brown | 310/5 |
| 3,121,196 | 2/1964 | Kasemir | 324/32 |
| 3,126,510 | 3/1964 | McLaughlin et al. | 324/7 |
| 3,136,943 | 6/1964 | Slichter | 324/7 |
| 3,175,151 | 3/1965 | Gurry | 324/60 |
| 3,187,206 | 6/1965 | Brown | 310/5 |
| 3,189,802 | 6/1965 | Zisman | 317/250 |
| 3,196,296 | 7/1965 | Brown | 310/11 |
| 3,253,207 | 5/1966 | Jauch | 320/1 |
| 3,256,481 | 6/1966 | Pulvari | 324/32 |
| 3,267,860 | 8/1966 | Brown | 103/1 |
| 3,292,059 | 12/1966 | Woods | 317/246 |
| 3,296,491 | 1/1967 | Brown | 317/3 |
| 3,344,344 | 9/1967 | Wales, Jr. | 324/32 |
| 3,361,957 | 1/1968 | Hings | 324/1 |
| 3,485,103 | 12/1969 | Custard | 382/73 |
| 3,518,462 | 6/1970 | Brown | 310/10 |
| 3,579,054 | 5/1971 | Moulton | 317/231 |
| 3,611,127 | 10/1971 | Vosteen | 324/72 |
| 3,727,127 | 4/1973 | Heidenwolf | 324/44 |
| 3,772,592 | 11/1973 | Rhodes | 324/32 |
| 3,774,110 | 11/1973 | Roveti | 324/133 |
| 3,812,419 | 5/1974 | Kaunzinger et al. | 324/32 |
| 3,846,700 | 11/1974 | Sasaki et al. | 324/72 |

(List continued on next page.)

FOREIGN PATENT DOCUMENTS 3201262 7/1983 Fed. Rep. of Germany.
140495 3/1960 U.S.S.R..

OTHER PUBLICATIONS

"Electrodynamics and Wave Propagation" by V. V.

(List continued on next page.)

Primary Examiner—A. D. Pellinen
Assistant Examiner—A. Jonathan Wysocki
Attorney, Agent, or Firm—Robert J. Fay; Thomas E. Kocovsky, Jr.

[57] ABSTRACT

A hermetically sealed, electrically insulative enclosure (A) is surrounded by a Faraday cage (B). At least one electrode (C) is disposed within the hermetically sealed enclosure. The volume of the enclosure is selectively altered such that an initial charge density in the neighborhood of electrod changes, which changes the electrode potential. The change causes a current to flow to or from the electrode which returns the electrode potential and the electrode surrounding space charge toward an equilibrium condition. In one embodiment, a current measuring circuit (D) is disposed between the electrode and the Faraday cage to derive a measure of the current flow therebetween. In another embodiment, a like electrode is disposed within another hermetically, sealed insulative enclosure which is shielded by the same or another Faraday cage. In the second embodiment, the measuring circuit measures the current flow between the two isolated electrodes.

24 Claims, 5 Drawing Sheets

U.S. PATENT DOCUMENTS

| | | | |
|---|---|---|---|
| 3,866,114 | 2/1975 | Johnston | 324/32 |
| 3,868,074 | 2/1975 | Hill | 244/77 |
| 3,916,305 | 10/1975 | Few, Jr. | 324/72 |
| 3,921,087 | 11/1975 | Vosteen | 330/2 |
| 3,942,101 | 3/1976 | Sayer et al. | 324/1 |
| 3,967,198 | 6/1976 | Gensler | 324/72 |
| 4,001,798 | 1/1977 | Robinson | 340/191 |
| 4,055,798 | 10/1977 | Kato | 324/32 |
| 4,056,772 | 11/1977 | von Berckheim | 324/72 |
| 4,101,325 | 7/1978 | Truax | 324/32 |
| 4,147,981 | 4/1979 | Williams | 324/32 |
| 4,205,267 | 5/1980 | Williams | 324/458 |
| 4,227,147 | 10/1980 | Miller | 324/72 |
| 4,270,090 | 5/1981 | Williams | 324/72 X |
| 4,277,745 | 7/1981 | Deno | 324/72 |
| 4,328,461 | 5/1982 | Butters et al. | 324/72 |
| 4,330,749 | 5/1982 | Eda et al. | 324/457 |
| 4,339,721 | 7/1982 | Nihira et al. | 324/457 |
| 4,342,964 | 8/1982 | Diamond et al. | 324/450 |
| 4,349,783 | 9/1982 | Robson et al. | 324/457 |
| 4,370,616 | 1/1983 | Williams | 324/458 |
| 4,386,315 | 5/1983 | Young et al. | 324/72 X |
| 4,424,481 | 1/1984 | Laroche et al. | 324/72 |
| 4,433,298 | 2/1984 | Palm | 324/457 |
| 4,437,065 | 3/1984 | Woudstra | 324/425 |
| 4,507,611 | 3/1985 | Helms | 324/323 |
| 4,520,318 | 5/1985 | Hascal et al. | 324/72 X |
| 4,523,148 | 6/1985 | Maciejewski | 324/351 |
| 4,642,559 | 2/1987 | Slough | 324/72.5 X |
| 4,686,605 | 8/1987 | Eastlund | 361/231 |
| 4,691,264 | 9/1987 | Schaffhausser et al. | 361/232 |

OTHER PUBLICATIONS

Nikolsy, Nauka (1973), pp. 80–81, Section 16–1 (with translation).
Principles of Electricity, C. V. Mahon, pp. 27–28, 1779.
Experimental Researches in Electricity, M. Faraday, pp. 364–369, 1839.
Principles of Physics and Meterology, J. Muller, pp. 374–375, 1848.
A Treatise on Electricity and Magnetism, 1st Ed., J. C. Maxwell, pp. 44–48, 72–89, 1873.
A Treatise on Electricity and Magnetism, 3rd Ed., J. C. Maxwell, pp. 50–51, 76, 79, 88–91, 1891.
The Theory of Electricity and Magnetism, A. G. Webster, pp. 258–261, 1897.
The Mathematical Theory of Electricity and Magnetism, J. H. Jeans, pp. 26–37, 1908.
Foundations of Potential Theory, O. D. Kellogg, pp. 174–177, 1929.
Introduction to Electricity and Optics, N. H. Frank, pp. 26–29, 58–59, 1950.
Electricity and Matter, N. Feather, pp. 28, 29, pp. 46–47, 228–231; 1968.
Electromagnetic Fields and Waves, V. Rosansky, pp. 198–201, 268–271; 1979.
Physics, A. L. Reimann, pp. 522–525, 1971.
Electromagnetism, P. Lorain and D. Corson, pp. 46–47, 1978.
Handbook of Physics, B. Yavorsky and A. Detlaf, pp. 249–250, 1975.
McGraw-Hill Dictionary of Physics and Mathematics, def. of "Electrical Potential"; 1978.
Electrostatic Measurement of Electrode Potentials, A. W. Ewell, Physical Laboratory, OSU, vol. VI, No. 4, pp. 271–283.
On the Possibility of Measuring Atmospheric Space Charge by Use of Sound Waves, G. L. Siscoe, Jour. of Geophysical Research, vol. 76, No. 18, pp. 4153–4159, Jun. 1971.
Probe Electric Field Measurements Near a Midlatitude Ionospheric Barium Release, S. Schutz et al., Jour. of Geo. Res., vol. 78, No. 28, pp. 6634–6635, Oct. 1973.
Cospar Space Research VII, Proceedings of Open Meetings of Working Groups of the 10th Plenary Meeting, London, Jul. 1967, edited by A. P. Mitra et al., pp. 339–340.
The Determination of Ionospheric Electron Content by Observation of Faraday Fading, W. T. Blackband, J. of Geo. Res., vol. 65, No. 7, Jul. 1960, p. 1987.
Principles of Physics and Meterology by J. Muller, pp. 373–374, 1848.
Fundamental Physical Constants and the Frontier of Measurement by B. W. Petley, pp. 145–147, 1985.
All About Gravitational Waves by G. Hodowanec, pp. 53–56, Radio Electronics, Apr. 1986.
The Physical Review, J. of Exp. and Theo. Physics, vol. VI, Ser. II, pp. 271–282, 1915.
Review and Eval. of the Literature on Electrostatic (List continued on next page.)

OTHER PUBLICATIONS

Generation in Tank Cleaning, Nat. Tech. Info. Serv., Feb. 1974.
Airborne Filters for the Measurement of Atmospheric Space Charge, Jour. Geo. Research, vol. 66, No. 10, pp. 3219-3226, Oct. 1961.
Adjustable Potential Gradient Measuring Apparatus for Airplane Use, Jour. of Geo. Res., vol. 66, No. 8, pp. 2393-2397, Aug. 1961.
The Dependence of Space Charge Spectra on Aitken Nucleus Concentrations, Jour. of Geo. Research, vol. 87, No. C2, pp. 1216-1218, Feb. 1982.
Absolute Measurements of Atmospheric Charge Density, R. Anderson, Jour. of Geo. Res., vol. 71, No. 24, pp. 5809-5814, Dec. 1966.
Airplane Instrument for Measurement and Vectorial Presentation of Elec. Pot. Grad., by A. Little, Jour. of Geo. Res., vol. 65, #, pp. 1959-1963, Jul. 1960.
The Electrical Charge on Precipitation at Various Altitudes and its Relation to thunderstorms, R. Gunn, Phys: Rev., vol. 71, No. 3, pp. 181-186, Feb. 1947.
A Field Mill for Tethered Balloons, S. G. Gathman, Rev. of Sci. Inst., vol. 43, No. 12, pp. 1751-1754, Dec. 1972.
Aircraft Electrification in Clouds and Precipitation, by I. M. Imyanitov, Nat. Tech. Info. Serv., Apr. 1971.
Spacecraft Charging on ATS-5, Air Force Surveys in Geophysics, No. 426, May 1980.
Danger to Jet Aircraft From Lightning, Air Weather Serv., Jul. 1964.
Atmosphere Electricity, J. A. Chalmers, pp. 1-375, 1967.
Practical Electricity, A Laboratory and Lecture Course, by W. E. Ayrton, 1883, pp. 84-89.
"Absolute Measurements of Atmospheric Charge Density" by R. V. Anderson, Journ. of Geophysical Research, vol. 71, No. 24, Dec. 15, 1966, pp. 5809-5814.
"Field and Wave Electromagnets" by David K. Cheng, Addison-Wesley Publishing Co., pp. 120-136.
"The Scalar Potential", Definition and Properties of the Scalar Potential, pp. 78-87.
"An Improved Wind Driven Electric Field Mill", by G. Freier, NTIS Publication 8/74.
"An Ungrounded Electronic Field Meter", by Cudney et al., The Review of Scientific Instruments, vol. 43, No. 9, Sep. 1972, pp. 1372-1373.
"Experimetnal Researches in Electricity", by Michael Faraday, vol. 1, 1839, pp. 364-377.
"Scalar Fields and Their Interactions", by Hodowanee, Int'l Telsa Society, Nov./Dec. 1987, pp. 21-25.
"Principles of Physics and Meteorology", by J. Muller, 1848, p. 374.
"Treatise on Electricity in Theory and Practice", by Aug. de la Rive, 1853, vol. 1, pp. 62-63, pp. 144-155.
"A Treatise on the Principles of Electrical Accumulation and Conduction", by F. C. Webb, 1862, pp. 1-147.
"Alternate Current Electrostatic Induction Apparatus", by Nikola Tesla, The Electrical Engineer, May 1891.
"Terrestrial Magnetism and Electricity", edited by J. Fleming, 1939.
"Handbook of Physics", by B. Yavorsky and A. Detlaf, Second Edition 1975, pp. 358-359.
"Secular Variation of Earth Current Potentials", by T. Yoshimatsu, Journal of Geomagnetism and Geoelectricity, vol. 1, No. 1, 1949, pp. 32-33.
"A History of Luminescence", by E. N. Harvey, 1957, pp. 27-280.
"Mariner 2 Observations of the Solar Wind", by M. Neugebaure and C. W. Snyder, Journal of Geophysical Research, vol. 71, No. 19, pp. 4469-4471.
"Balloon Measurement of Atmospheric Electric Potential Gradient", by T. Ogawa et al., J. of Geomag., vol. 19, No. 4, 1957.
"A Method of Measuring Electron and Ion Densities in the region of 40-80 Kilometers", by A. Oster et al., Jour. of Geophysical Res., vol. 73, No. 13, Jul. 1968, pp. 4421-4424.
"Ionospheric Electron Content", by K. Yek et al., Journal of Geophysical Research, pp. 4557-4559.
"Probe Electric Field Measurements", by S. Schultz et al., J. of Geophysical Research, vol. 78, No. 28, Oct. 1973, pp. 6634-6635.
"Anomalous Diurnal and Secular Variations in the Self-Potential of Certain Rocks", by T. Townsend Brown, 1976.
"Rowland's Physics", by J. Miller, Physics Today, Jul. 1976, pp. 29-35.
"On the Magnetic Effect of Electric Convection", by H. Rowland, American Journal of Science, (3)XV, 30-38, 1878.
"On the Electromagnetic Effect of Convection Currents", by H. Rowland and C. T. Hutchinson, Philosophical Magazine, 5, XXVII, 445-460, 1889.
"The Surface Barrier Volume Wave Transducer", by Raaen et al., Journal of Physics C, vol. 13, No. 2, Jan. 1980, pp. 283-297.
"Some Important Null Experiments", by B. W. Petley, 1985, pp. 282-287.
"1986 International Tesla Symposium-The Fundamental Concepts of Scalar Electromagnetics", by T. E. Bearden.

ABSOLUTE ELECTRICAL POTENTIAL MEASURING APPARATUS AND METHOD

BACKGROUND OF THE INVENTION

The present invention relates to the art of electrical potential determination. It finds particular application in determining true or absolute potential and measuring other potentials on an absolute scale. It is to be appreciated that the present invention is applicable to monitoring the potential and change in potential relative to an absolute scale. The potential of earth ground or other objects such as aircraft, fluid or grain containers, chemical reaction tanks, hospital patients, and the like may be measured.

The present state of the art of potential measurement consists of the comparison of two potential sources by observing the voltage difference between them and assuming that one of them is of either an arbitarily assigned zero or non-zero value. This provides knowledge of a gradient or voltage difference without knowledge of the true or absolute potential of either source. Earth ground is often considered as reference zero for convenience, a convention that dates back to the earliest days of electrical science. Mathematically, electrical potential is defined as the work required to bring a unit of charge from infinity to the location of that potential without disturbing its value. Although infinity is defined as zero potential, the earth is considered a more convenient local zero potential reference by common convention. It can be shown, however, that the absolute potential of the earth is not zero.

Instruments located on an aircraft or other objects that are isolated from the earth are commonly "grounded" to the isolated object. An aircraft, however, tends to assume the potential of the surrounding atmosphere. Although the isolated object is assigned the zero potential value, it is frequently at a different potential relative to the earth. For example, in fair weather, an aircraft at cruising altitude may have a potential that is 100,000 volts different from that of the earth surface. If the aircraft passes through a charged cloud of a severe thunderstorm, the potential of the aircraft and its occupants may experience a change in potential of 100,000,000 volts in a few seconds or minutes.

Aircraft in flight experience different aerodynamic forces due to friction changes when the potential of the aircraft surface changes. Large potential changes may contribute significantly to wind shear phenomenon. A detection system responsive to electrostatic potential and its change may warn of impending wind shear and compensate for such sudden occurences. The devices presently in use to measure space charge gradient will not provide the same information.

Many costly accidents happen each year involving the transfer and storage of explosive and flammable gases and liquids. Electrical sparks may trigger explosions during transfer and handling of explosive fluids and powders, such as in grain storage silos, in coal mining, during mid-air refueling, during tank cleaning, and the like. Electrical sparks can also cause flash fires in hyperbaric oxygen chambers, during tanker docking, and the like. The knowledge of true static charge distribution can be a significant aid to the reduction in loss of life and property and the development of safety practices.

The potential of the earth is not constant. Rather, it varies with time, location, and natural phenomena. Heretofore, observations have been made of electrical current flow through the earth and its atmosphere. These telluric current flows manifest themselves in transmission problems across long distance telegraph and telephone lines, particularly lines which extend through regions of the earth that are at significantly different potentials. These earth currents, of course, would not exist if the earth had a uniform and constant potential.

Since the eighteenth century, observations of atmospheric electricity, thunderstorms, the aurora, and fair weather vertical gradient, have shown us that there is a considerable variation with time and location, in the relative potential of the atmosphere, clouds, and earth surface. Today, it is generally accepted that the surface of the earth is some four hundred thousand volts negative in comparison to the electrosphere, located fifty thousand meters above. Lightning proves that charge concentrations of millions of volts potential can be found within the atmosphere. Swarms of energetic charged particles shower the earth from the solar corona and from beyond our solar system, suggesting that the potential of the earth may be changing with the tides, weather patterns, magnetic storms, seasons, and solar cycles.

It has been suspected that such potential changes influence agriculture, health, transportation, industry, and the like. However, the convention of referencing earth ground potential as zero has obscured correlations between electrical potential changes and observed phenomena.

There are a variety of industrial processes which seem to suffer from "full moon" type effects. From the rate of build-up of boiler scale, to the rate of polymerization of colloidal systems, there is something going on which has not yet been identified. It may be solar wind in a twenty eight day cycle mimicking that of the moon. Bleeding rate during surgery, migraine onset, and neurological disorders show cyclic data patterns which sometimes, but not always, follow a lunar pattern.

Studies have been undertaken linking weak slowly changing magnetic fields with biological and physiological activity. No satisfactory connecting or causal link has been established as a mechanism for this to happen. There is a link between change in pH activity and many of these types of effects. pH represents a form of charge concentration or distribution which is often static in nature. A knowledge of absolute potential and its slow changes with time may explain these effects.

The present invention provides an apparatus and method for determining variations in potential which are comparable with potential measurements made at times or places with a different ground potential.

SUMMARY OF THE INVENTION

In accordance with one aspect of the present invention, an apparatus is provided for measuring electrical potential. A substantially hermetically sealed, electrically insulative enclosure has a conductive cage therearound in order to fix an amount of electric charge contained in its interior. A first electrode is disposed within the enclosure and electrically isolated from the cage for sensing the electrical potential in the interior. A charge density changing means is provided for changing the charge density within the enclosure interior. Changing the charge density changes the potential sensed by the first electrode correspondingly. A potential measuring means is operatively connected with the electrode for measuring the sensed potential change.

Suitable charge density changing means may include means for changing the volume of the interior, means for changing the pressure distribution within the interior, or the like. Note that the sensed potential change for a given volume change will differ with the charge density which varies with the initial potential of the interior. The potential measuring means may, for example, measure an electric current flow from the electrode through the potential measuring means to the conductive cage.

In accordance with another aspect of the present invention, an electrical potential measuring apparatus includes a hermetically sealed, electrically insulative enclosure which has a conductive cage therearound. A hollow electrode is disposed within and electrically isolated from the cage. A current measuring means provides a current path between the electrode and the cage and measures current flow along the current path. In this manner, changes in the potential of the enclosure cause a current flow to or from the isolated hollow electrode, which measured current flow is indicative of the potential change of the cage.

In accordance with another aspect of the present invention, an electrical potential measuring apparatus includes a hermetically sealed electrically insulative enclosure which defines an enclosed volume therein. An electrically conductive cage surrounds the enclosure and a hollow electrode is disposed within the volume. An enclosed volume changing means selectively changes the enclosed volume to cause a current flow between the hollow electrode and the cage. A current measuring means measures the current flow as the enclosed volume is changed.

In accordance with another aspect of the present invention, a method of measuring electrical potential is provided. A charge density within an insulating enclosure is changed. The change in charge density causes an electrical current from an electrode isolated within the enclosure to an electrically conductive cage which surrounds the enclosure. The charge transfer between the electrode and the conductive cage is measured.

In accordance with a more limited aspect of the invention, the charge density changing step includes changing the volume of the insulating enclosure and further including the step of correlating the volume change with the charge transfer to determine potential change.

In accordance with another aspect of the present invention, an electrical potential measuring method includes measuring current flow between an electrode hermetically sealed within an insulative enclosure and a conductive cage surrounding the enclosure.

An advantage of the present invention is that it enables earth ground potential to be measured.

Another advantage of the present invention is that it permits the measurement of space charge relative to an absolute reference.

A further advantage of the present invention is that it measures potential on an absolute scale. The present invention enables ready comparison of two or more potential readings that are taken simultaneously at physically remote or unconnected locations.

Yet another advantage of the present invention is that it enables correlation between changes in the earth's potential and phenomenon, activities, processes, and the like, which are influenced by charge distribution.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts and in various steps and arrangements of steps. The drawings are only for purposes of illustrating preferred embodiments and should not be construed as limiting the invention.

DETAILED DESCRIPTION OF THE PREFERRED EMBODIMENTS

Figure 1:
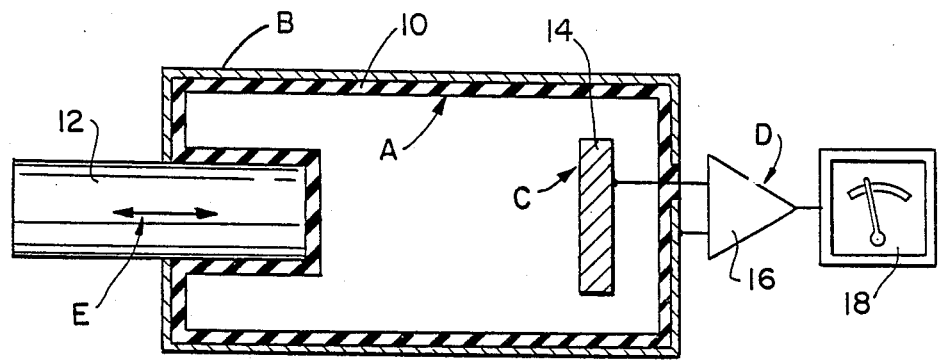
FIG. 1 is a diagrammatic illustration of a potential measuring apparatus.

With reference to the figures, a hermetically sealed enclosure A defines an interior space which is hermetically sealed from the atmosphere. An electrical influence shielding means, such as a Faraday cage B, surrounds the enclosure A to provide electrical shielding from electric fields and gradients in the surrounding atmosphere. One or more electrodes C are disposed within the interior of the enclosure for sensing electrical potential. A measuring means D measures current flow between the cage B and the electrode C or between two electrodes as the space charge density returns toward equilibrium. In some embodiments, a space charge changing means E selectively changes the distribution of the space charge density within the enclosure interior to cause a disruption to an equilibrium condition. In other embodiments, the space charge density and potential adjacent the cage change and the current flow that brings the space charge adjacent the electrodes back into equilibrium is measured.

The absolute volt connoted a standard unit of measure of potential difference, e.g. 1 volt.

The absolute electrometer was a scientific instrument developed by Lord Kelvin for precision measurement of the potential difference between two discs using the force of gravity.

From the location of measurement, an isotropic non-zero electric charge distribution connotes having the same properties in all directions and therefore no gradient across the surface of the measuring device. An isotropic distribution may be by area at a constant distance or by volume, or a combination of both, or it may be by induction at a distance or by contact as in the sense of pressure. A volume distribution need not be homogeneous, so long as its combined flux at the point of detection gives the appearance of an isotropic charge source. From the interior, the nonisotropic components of charge source would be shielded by the closed conducting surface. The distribution can also be that of a surrounding space charge which might change in density with distance. No distinction is made as to bound, unbound, apparent, or polarized charge sources.

The closed conducting surface may be directly connected to a source of electric potential being measured, to serve as the single input of a "unipole" voltmeter.

When a hollow closed conducting sphere is located in free space, the interior volume is effectively shielded from any potential gradient present in that space. After a period of time sufficient to allow for the conduction of charge to establish a static equilibrium, the potential of the sphere and its interior contents are that of the average potential of the volume occupied by the sphere; were it not there. For the static condition, and based on the $1/r^2$ Coulomb force law, this potential will have equal value throughout the volume. By Poisson's rule, for a non-zero potential there must be volume charge density distributed uniformly throughout that volume. All lines of electric force cancel within the sphere, and there is no gradient and therefore no vector of electric intensity. For this reason, the conventional prior art methods of detecting voltage difference or voltage gradient are unable to identify or measure this uniform charge distribution. For the purpose of understanding the present invention, imagine we are located in a very large hollow conducting surface of constant potential, wherein the volume charge density is homogeneous and isotropic. It is the purpose of this invention to identify the charge density and the related absolute electrical potential value at our location.

Since the time of Michael Faraday, lines of force have been considered to terminate upon charge sources. These sources are expected to be distributed within the volume of the sphere in the same quantity per unit of volume as in the space outside the sphere. The same condition is expected to exist within a closed conducting surface B which contains the present measuring apparatus. For this surface, the flux in and flux out are of equal value but opposite direction. For purposes of measurement, they cancel according to the principle of superposition. Although they are not subjected to fields of external origin, the charge centers or sources of charge concentration are undergoing a constant thermal and Brownian movement which accounts for their electromagnetic coupling and subsequent distributive forces. Thus, the charge sources act in a similar way to air molecules which establish a uniform air pressure within a closed chamber. In fact, they may be charged molecules in most cases.

It is a generally accepted rule that there is no charge within a charged conductor. The charge is located entirely upon the surface of the conductor. However, it would be more accurate to state that there is no detectable charge concentration within a conductor because there is no potential gradient nor electric intensity within the conductor. In the 1800's, earth ground was defined as having zero potential. Therefore the statement that there is no charge within the conductor is the same as saying that the conductor is at earth ground potential, because "charge" was being measured relative to earth ground potential.

Usually, "space charge" refers to a concentration of charge of varying volume density and potential different from earth ground. It can be measured with instruments which rely on a potential gradient or voltage difference between the detection electrode and the space charge, such as the field mill. This means that the potential of the space charge is measured with reference to earth ground or a conductor serving in place of earth ground. The field mill uses a grounded element to intermittently shield flux from the sensing electrode. A measurable flux indicates the presence of a gradient field. In many cases the space charge is contained by a conductor at ground potential so that its potential is maximum at its center and falls off to ground potential at the conductor containing it. A "uniform non-zero charge distribution" is different from a space charge concentration which has been measured and reported by the prior art. Uniform non-zero charge distribution has neither been detected nor its consequences considered prior to the present invention.

It has long been accepted that the source of electric force as observed in the space exterior to a charged sphere can be considered mathematically with equal results, as if it were: (1) located entirely upon the surface, (2) located as if it were totally concentrated at a central point, or (3) evenly distributed throughout the volume of the sphere. It has been proven that the same would be true for a hollow sphere, or for that matter an uneven distribution of the same total charge located within the hollow sphere. The form of the closed surface is not limited to that of a sphere in order to contain the flux concentration. Any closed conducting surface, i.e. a Gaussian surface, serves as a gradient shield, and therefore for the outer housing of the absolute potential device.

Because prior art measuring techniques have relied on the detection of voltage difference or potential gradient, no uniform charge density has been directly observed within a conductor, and the convention that all charge resides on the outside surface gives a practical working explanation for most purposes. The concept of superposition of forces restricts the observation of gradient, as produced by a contained uniform charge distribution, to its boundary and beyond.

Because total charge concentration at a mathematical point would result in an infinite potential at that point, the choice of an even distribution throughout the volume of the conductor and its hollow interior is preferred. For simplicity of explanation, the effects of conductor work function, temperature, and the choice of material, gas, or vacuum within the hollow space have been avoided in the present discussion. Under a quantum view of wave functions within the volume limits, the same practical results are attained as by considering the application of classical electron theory.

The hollow conducting surface B also shields the effect of internal electrical intensity from influencing the space exterior to the conductor. Thus, a fixed total charge contained within the closed surface can be divided, moved about, and concentrated by mechanical or magnetic means without changing the overall potential of the conductor or that of its surroundings. This charge redistribution creates space charge concentrations of different charge density. There is a difference of potential between these space charges which can be measured or will cause a current to flow in a measuring circuit. It is assumed that no charge enters or leaves the volume contained by the conductor as a result of that movement. This function is performed by hermetically sealed and electrically insulating coatings, dividers, or barriers A. The degree of insulation and charge flow restriction between the conductor and exterior space is selected to accommodate the rate of movement of charge within the conductor, allowing equilibrium to be established with a changing potential of the exterior space, and minimize disturbance to the precision of measurement. In some instances it may be desirable to restrict the amount of current flow between the conductor and its environment to reduce the hazard of electric spark ignition. In other cases it may be necessary to employ current enhancing methods such as ion sources, pointed electrodes, and the like to encourage a more rapid attainment of equilibrium with the space being measured. This also applies to electrode coupling.

Within the hollow of the conductor, the movement of charge isolating partitions creates separate divisions of the total volume. These subvolumes contain different values of charge density. Electrodes C located in these subvolumes are likewise caused to be at different potential which difference can be measured by conventional means. Although measurement is possible with partial isolation of these subvolumes by imperfect electrical insulated boundaries such as air or gas, the preferred embodiment uses as complete an isolated boundary as possible and, optionally, a conducting barrier in addition to the insulating one. This also serves to shield these charge concentrations from induction by fields arising from a motor or detection amplifier components. The better the electrode coupling and volume isolation, the more charge is available to the detection circuit.

Thus, a fixed quantity of charge, within a fixed volume, is redistributed within that volume to create different densities of space charge in selected subregions. These are able to be detected by the difference in their potential. This process can be reversed and repeated to produce an alternating current signal which, when amplified, can be equated to the constant absolute potential of the closed conducting surface defining the fixed volume.

Measurement can be of current or voltage, between electrodes coupled to volumes of differing potential and charge density. It can also be by use of a gradient sensing device such as a field mill or space charge aspirator or the like. The construction, placement, and mounting method for the electrodes C is chosen to provide the desired properties of capacitance, space charge coupling, and microphonics production, in addition to weight and size. For example, a thin wire supported at one end would provide a minimum input capacity, but would be free to move with vibration or acceleration and create microphonic noise. A rigid electrode shell, insulated from but in physical contact with the conductor would reduce the microphonic noise source at the expense of a lower input voltage value to the preamplifier. This is because its input capacitance to the amplifier would be so much greater. Electrodes can be perforated, segmented, hollow, coiled, etc. to reduce their weight or improve their effectiveness. Metal film coatings or thin film deposits can also be used to advantage for construction of barrier elements.

With particular reference to FIG. 1, the enclosure A includes a flexible liner 10 which extends around an interior surface of the Faraday cage B and an exterior surface of a piston 12 of the space charge density changing means E. An electrode 14 is mounted within the interior volume of the liner 10. The potential measuring means D includes a differential amplifier circuit 16 which is interconnected with the electrode 14 and the Faraday cage B. A meter or other display means 18 is interconnected with the differential circuit 16 to produce a man-readable indication of the measured potential change.

As the piston 12 is moved inward stretching the liner, the interior volume of the enclosure is contracted increasing the charge density. Conversely, as the piston is extracted, the interior volume increases and the charge density decreases. The changes in the charge density cause corresponding changes in the potential difference between the electrode 14 and the Faraday cage B. The potential difference $\delta V$ expressed in volts is given by:

$$\delta V = \frac{k\pi\rho}{\epsilon} \delta v$$

where $\rho$ is the space charge density, $\epsilon$ is the permativity, $\delta v$ is the change in volume, and k is a constant which is related to the geometry of the enclosure and the electrode. Initially, the space charge density and the potential at the electrode 14 and at the Faraday cage B are in equilibrium. If the electrode 14 were at an absolute zero potential, then the space charge density would similarly be zero. However, when the electrode 14 and the Faraday cage B are both initially at an earth ground, the charge density within the enclosed volume is non-zero. By knowing the volume change, the value of the constant k can be determined experimentally for the actual geometry of the enclosure and electrode.

Calibration of the absolute potential measuring device can be done by using a known voltage source capable of providing two or more different voltage values relative to earth ground. These voltages are sequentially connected to the outer conducting shield or cage B of the device. The difference in output signal indicated by the measuring circuit D is extrapolated to the point at which zero output would be expected, i.e. a zero charge distribution within the sensing volume. It may be necessary to adjust the preamplifier input voltage offset to compensate for errors caused by dissimilar components having different work functions. The zero point of an A.C. coupled amplifier can be adjusted by short circuiting the preamplifier input. It may be helpful to connect the input load resistor to an adjustable bias voltage other than power supply ground, so that a null or minimum signal can be adjusted to indicate the removal of false signal error. A means of adjustment for calibrating gain and offset can be incorporated in the measurement circuit. Potential readings can be either differences from a reference such as earth ground, or absolute by referring to an output that would read zero with no charge redistribution within the conductor. It may be found desirable to incorporate temperature, pressure, power source, and other correction methods for the purpose of maintaining stable accurate performance under differing conditions. A built in calibration standard for the electronics may be helpful.

Figure 2:
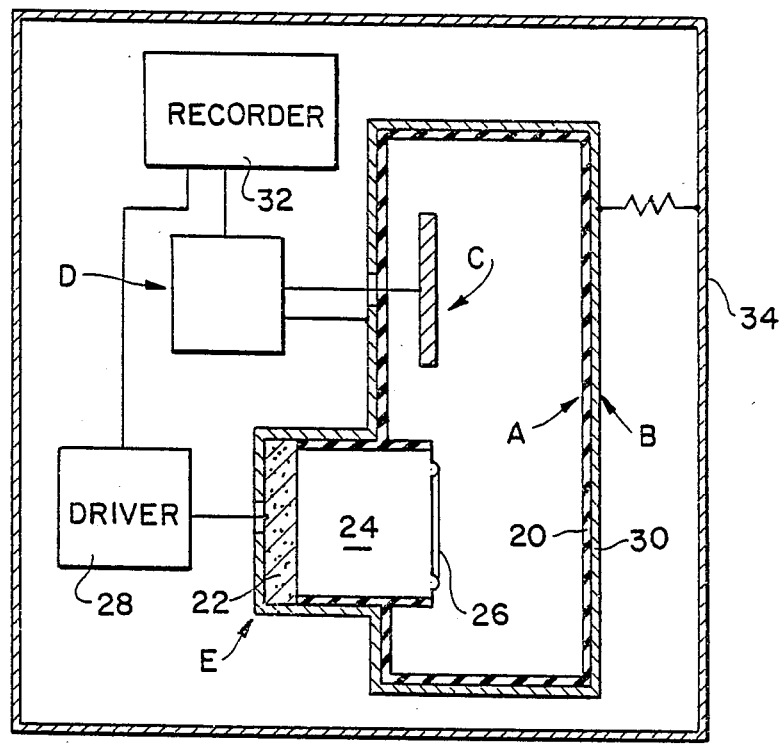
FIG. 2 is a diagrammatic illustration of an alternate embodiment of the potential measuring apparatus.

With reference to FIG. 2, the enclosure A is a rigid insulative structure 20, e.g. plastic or ceramic which provides a hermetic seal. The space charge density changing means E includes a piezoelectric crystal 22 which is connected by a fluid coupling 24 with a movable diaphragm 26. By applying electrical pulses to the piezoelectric crystal with a driver circuit 28, the diaphragm 26 is caused to vibrate at a known rate and to a known degree. Vibration of the diaphragm changes the volume within the insulative enclosure 20 which changes the space charge density. A measuring circuit D measure current or charge flow between an inner Faraday cage 30 and the electrode C, i.e. potential change. A recorder 32 records a retrievable record of the measured potential changes and the corresponding volume changes. An outer Faraday cage 34 sheilds the inner cage 30 and other components.

Figure 3:
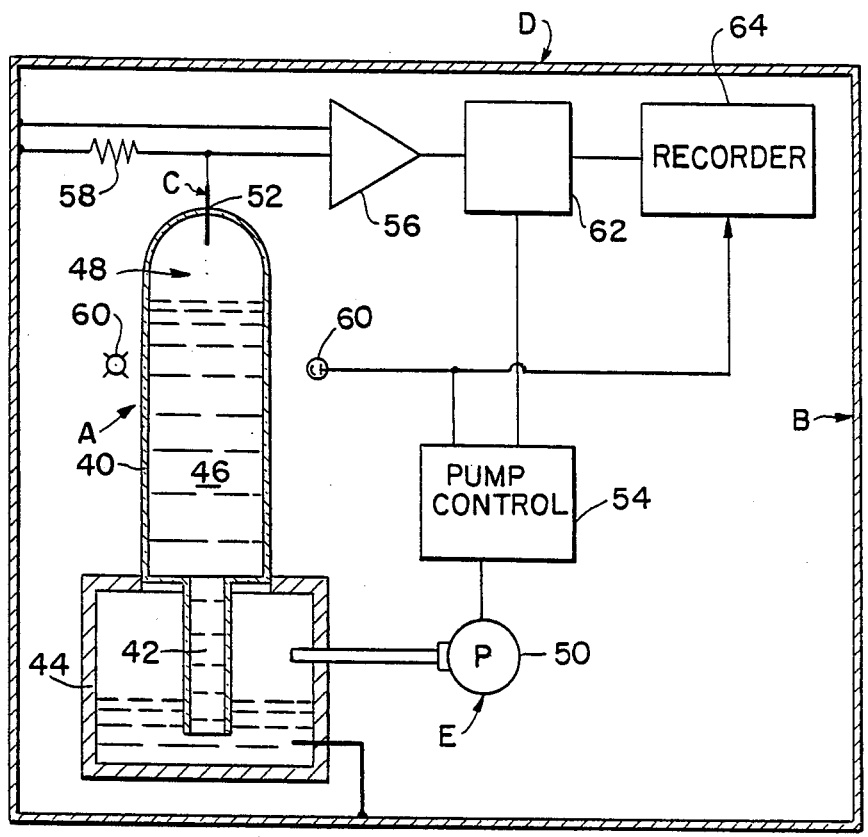
FIG. 3 is another alternate embodiment of the present invention in which an interior volume is changed.

With reference to FIG. 3, the insulative enclosure A includes a glass tube 40 which is sealed at an upper end and connected through a capillary or restricted tube portion 42 with a sealed reservoir 44. The enclosure contains a heavy fluid 46, such as mercury, such that a vacuum or low pressure region 48 is defined at the top of the tube. The space charge density changing means E includes a pump 50 which changes the pressure within the sealed reservoir 44 to increase and decrease the volume of the low pressure region 48. The electrode C includes a needle electrode 52 which is disposed in the low pressure region. A pump control 54 cyclically causes the pump 50 to increase and decrease the pressure, hence the volume and space charge density of region 48.

The mercury or other heavy fluid 46 is connected with the Faraday cage B. A unity gain differential amplifier 56 is interconnected with the electrode 52 and the Faraday cage to measure the potential difference therebetween. A high resistance 58 is interconnected between the inputs of the unity gain amplifier to provide a predictable electrical resistance therebetween without regard to the actual internal resistance of the unity gain amplifier. As the pump control 54 cycles the pump such that the heavy fluid cycles between the level of level detectors 60 at one extreme and contacting the electrode 52 at the other, a measuring circuit 62 measures the current flow between the cage B and the electrode 52 as the space charge returns toward equilibrium. A recorder 64 records the corresponding volume changes and potential current flows. As above, the current flow can be converted to a measure of potential on an absolute potential scale, a measure of the change of relative potential of the cage B with time, or the like.

It is to be appreciated that the present invention functions whether the low pressure region 48 is a vacuum or an insulating gas. However, because mercury vapor in the region 48 and mercury 46 may create a current flow path between the electrode and ground, an insulator may optionally be placed on the upper surface of the heavy fluid 46.

Figure 4:
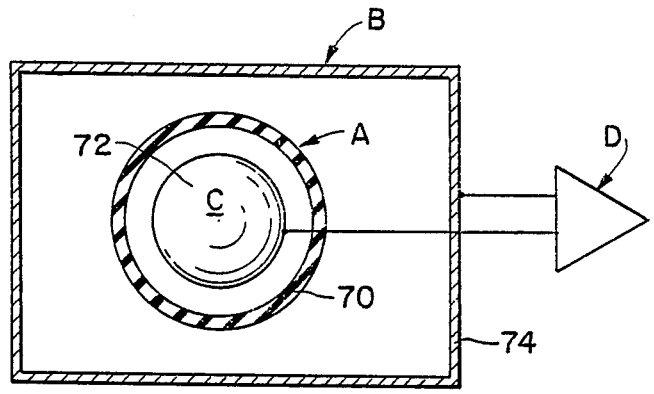
FIG. 4 is a diagrammatic illustration of another potential measurement apparatus embodiment with a changing space charge volume.

With reference to FIG. 4, the enclosure A is a spherical expandable member 70. The electrode C is a hollow metal sphere 72 which is disposed within the expandable bladder 70. The Faraday cage B is a sealed, metal cage 74 which surrounds the bladder 70. By selectively redistributing the pressure within the Faraday cage to increase and decrease the pressure immediately surrounding the bladder 70, the bladder is caused to expand and contract changing the volume defined therein, hence the space charge density. A differential measuring circuit D measures the space charge density dependent current between the Faraday cage 74 and the spherical electrode 72. Optionally, the cage B may be vented to the atmosphere to measure atmospheric pressure changes or may be connected with another source of pressure to be measured.

If one chooses to use the convention of considering singular or unit charge sources as on located surfaces, then it is to be understood that the invention can be described in terms of surface flux, the volume changes being accompanied by a corresponding change in surface area. A surface charge is induced at the interface of the void and the Gaussian surface, which is equal to that required to maintain a uniform potential throughout the volume, i.e. the same potential as that of the outer surface. This charge is distributed on the inner surface as well as any portion of the inner surface that is electrically isolated. Any movement, which effectively changes the volume of the void, the area of the electrode or its inner surface component, or the degree of void to surface area coupling, induces the charge distribution to change. This change in the charge distribution is measured as a current or voltage acting between the two electrodes. That is, using the reference of the void potential which is substantially free of charge, as if it were the infinite distance of no charge from classic electrostatic theory, the voltage or potential can be required to move a charge between this "infinity" and the cage B.

Excess charge residing on the surface is the charge that is required by the defined void to support a continuous, equal potential within the volume of the outer and inner voids. The potential is everywhere equal within the conductor. Movement of the electrode does relocate some surface charge. The redistribution of charge is measured by the measuring circuit D. The energy expended or consumed in the measuring process, though minute, is supplied to the system by the force utilized to change the volume. In evaluating the output signal, any redistribution of charge within the inner surface must be taken into account.

Figure 5:
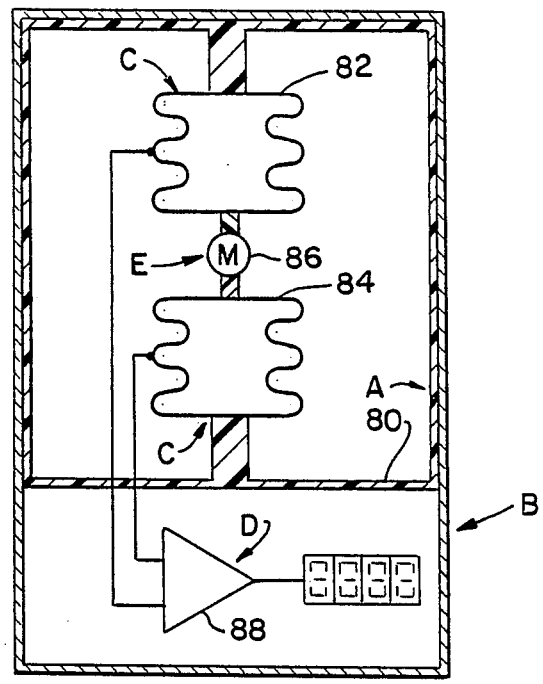
FIG. 5 is another alternate embodiment of the present invention in which a pair of space charge surrounding volumes are varied complimentary.

With reference to FIG. 5, the enclosure A is an insulating liner 80 which defines a hermetically sealed volume therein. The electrodes C include a first, sealed metal bellows 82 and a second, sealed metal bellows 84 which are mounted in an insulating relationship to each other within the enclosure 80. The charge density changing means E includes at least one linear motor which alternately compresses one of the bellows as it expands the other and vice versa. In this manner, the volume within the interior of the electrode bellows changes cyclically in an equal and opposing manner. The potential measuring means D includes a differential measuring circuit 88 which measures the space charge equalizing current flow between the first and second bellows electrodes 82, 84.

More specifically, the differential circuit 88 measures a current flow between the bellows type electrodes as one expands and the other contracts. Because the current flows alternately and cyclically between the two electrodes only and not to the Faraday cage, the average absolute potential of the electrodes is measured which in equilibrium is the same as the potential of the Faraday cage B. If both bellows electrodes are initially at the same potential, the variations of magnitude of the measured current will be generally proportional to changes in the space charge hence potential surrounding the two bellows on the absolute scale. The higher the potential on the absolute scale, the greater the measured current. Alternately, the bellows may cycle in unison and be connected in parallel to the same input of the differential amplifier. The other input may be connected with cage B to measure changes in the cage potential.

Figure 6:
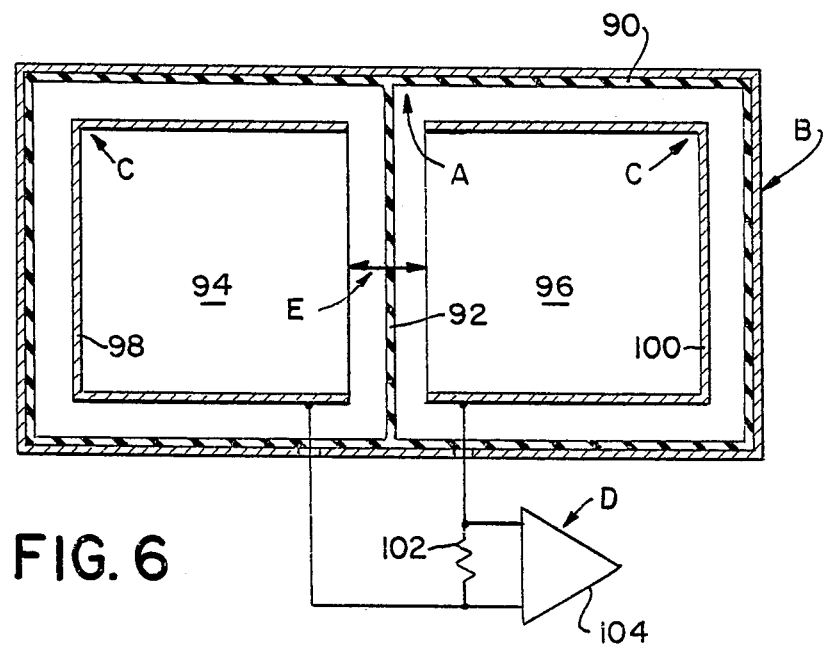
FIG. 6 is a diagrammatic illustration of another alternate embodiment with complimentary space charge volume changes.

With reference to FIG. 6, the enclosure A includes an outer insulating wall 90 and a movable barrier 92 which divides the interior of the enclosure into a first interior volume 94 and a second interior volume 96. The electrode means C includes a first metal cup 98 disposed within the first interior volume and a second electrode cup 100 disposed within the second interior volume. The charge density changing means E includes a motor or the like for flexing the barrier 92 cyclically back and forth such that one of the interior volumes is contracted by the same amount that the other is expanded. These complimentary changes in the interior volumes cause a cyclic current to flow between the electrodes through a resistor 102. A difference circuit 104 measures the voltage across the resistor 102 which voltage varies with the current flowing therethrough, hence the space charge density. Again, the greater the absolute potential of the electrodes, the greater the current, hence the greater the measured potential difference.

Figure 7:
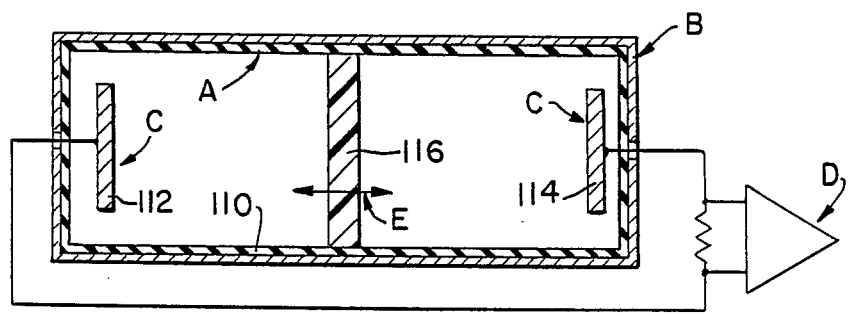
FIG. 7 is yet another alternate embodiment with complimentary space charge volume changes.

With reference to FIG. 7, the enclosure A is a cylinder 110 with closed ends of an insulating material. The electrode means C includes a first electrode 112 disposed at one end of the cylinder and a second electrode 114 disposed at the other end of the cylinder. The charge density changing means E includes a piston 116 which is slidably and sealingly mounted within the cylinder. A motor means oscillates the piston back and forth toward the first and second electrodes to redistribute the space charge density within the cage B. In this manner, an interior volume to one side of the piston is contracted by the same amount which an interior volume to the other side of the piston is expanded.

Figure 8:
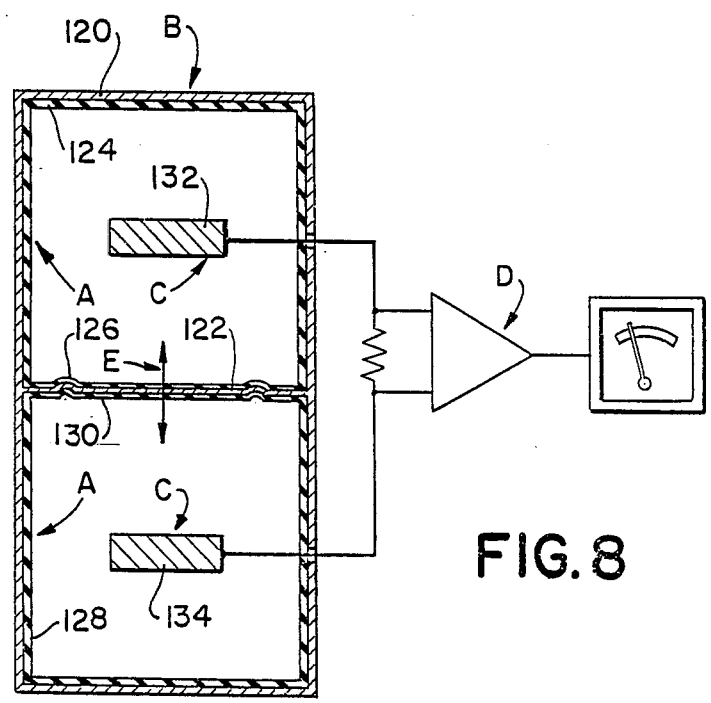
FIG. 8 is another alternate embodiment with plural space charge volume changes.

With reference to FIG. 8, the Faraday cage includes an outer surrounding cage 120 with an electrically conductive, flexible divider 122 that divides the cage into two sections, electrically isolated from each other by the flexible barrier 122. The enclosure A includes a first insulative liner 124 of which at least side 126 is flexible and a second enclosure 128 of which at least side 130 is flexible. A first electrode 13 is defined in an interior volume of the first enclosure portion and a second electrode 134 is disposed within the interior of the second enclosure portion. The charge density varying means E includes a motor or the like for flexing the flexible cage wall 122 and the flexible enclosure walls 126 and 130 as a unit to expand and contract the first and second enclosure interior volumes by equal and opposite amounts.

Figure 9:
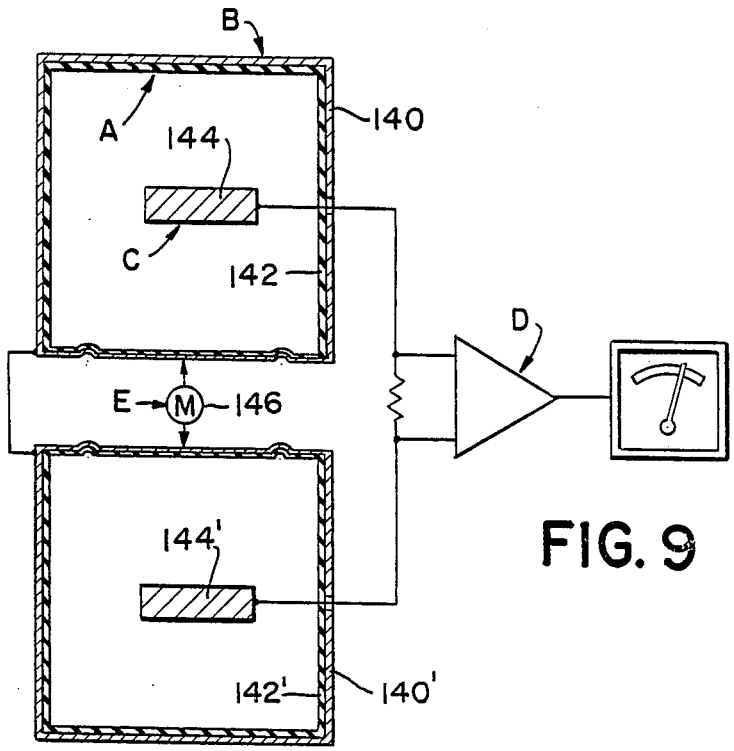
FIG. 9 is another alternate embodiment with a plurality of changing space charge volumes; and, FIG. 10 is another alternate embodiment which provides details of electronic measuring circuitry.

With reference to FIG. 9, two like Faraday cages 140 and 140' surround like insulating, hermetically sealed enclosures 142, 142'. The Faraday cages are electrically connected together. A first electrode 144 is defined within the interior of the first enclosure 142 and a second electrode 144' is defined within the interior of the second enclosure 142'. The charge density changing means E includes a motor 146 which cyclically flexes sides of the Faraday cages and enclosures in equal and opposite amounts. The potential measuring circuit D measures the current flow between the two electrodes as the motor 146 expands and contracts the interior volumes of the enclosures. Optionally, like additional Faraday cage and enclosure constructions may be expanded and contracted by the motor. The expansions/contractions of the various constructions may be out of phase by 180°, 90°, 120°, or the like. Electrodes in each construction may also be connected with the potential measuring circuit.

Figure 10:
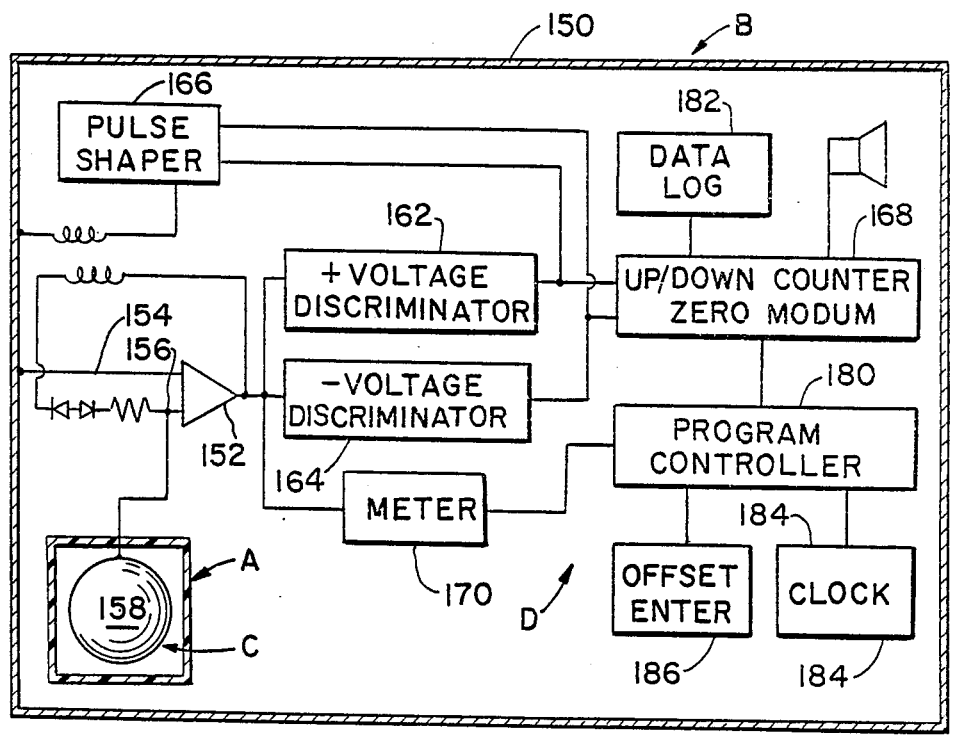

With particular reference to FIG. 10, the Faraday cage B includes a metal case 150 which is connected with earth ground. An operational amplifier 152 or a field effective transistor has an inverting gate input 154 connected with the case. In this manner, the metal functions as an electrode which is connected to earth ground and which varies with variations in the potential thereof. A high impedance gate 156 is connected with a hollow electrode 158 and is allowed to float relative to the ground potential and the case 150. The potential of the hollow electrode 158 remains constant even as the potential of the case 150 fluctuates. The operational amplifier 152 detects the difference in potential between the reference, hollow electrode 158 and the changing cage potential. The cage 150 may be connected with earth ground, an airplane superstructure, or the like to measure variations in the potential thereof.

The operational amplifier 152 produces an output difference signal which varies with the difference in potential between the floating electrode 158 and the cage 150. The maximum gate voltage of operational amplifier and field effect transistors is commonly limited to a range of a few volts, whereas the measured potential may vary over thousands of volts. The measuring circuit D is configured to adapt the operational amplifier to this higher range. Specifically, voltage discriminators 162, 164 determine when the operational amplifier difference signal is approaching a preselected standard deviation, e.g. one volt. Each time the output signal reaches the preselected standard voltage deviation value, the voltage discrimination circuits concurrently cause a pulse shaper 166 to add or subtract an incremental amount of charge to the floating electrode and cause a counter 168 to be incremented or decremented. The charge added by the pulse shaper is carefully selected to correspond precisely to one standard deviation of the operational amplifier output signal. When the system comes to equilbrium, the count on the counter is indicative of the difference between the curent and the initial voltage difference between the floating electrode and cage. A meter 170 indicates fractions of the standard voltage deviation.

For long term measurement, a computer or other automatic counter reading means 180 may read and store the count in an appropriate memory 182. A clock 184 may be utilized to cause the counter reading means to read the counter at preselected intervals. An offset entering means 186 is provided for entering a corresponding or other preselected offset to the count on the counter 168. Alternately, an arbitrary value of reset charge may be added. Calibration readings may be taken before and after a given charge addition to determine the amount of the reset charge. Appropriate adjustments to the amplification of the signal to the reader may be made.

Although illustrated for convenience of explanation as discrete components, preferable miniaturization can be attained in the above embodiments by reducing the above described embodiments to a single chip. Optionally, optical coupling can be used to transmit the data from the chip to a remote read out device without disturbing the intervening field or space charge. If the cage is set to a local earth ground, the output will be indicative of changes in earth ground potential caused by solar wind, geomagnetic fields, atmospheric conditions, earth-tide currents, local anomolies in the geology, the local net charge density, and the like. Long term studies of solar wind during sun spot cycles and long distance probes of our solar system will be facilitated with the present invention's ability to measure absolute electrical potential.

If carried on an aircraft, the output may measure the relative potential of the aircraft as compared to a preselected earth or other potential. This will enable the voltage potential difference of aircraft involved in in-flight refueling or mid-air transfer operations to be coordinated. The device may also be utilized to monitor the relative potential between aircraft and landing facilities, grain elevators and freight cars, storage tanks and their contents and floating tankers, the ends of large conveyors of bulk transfer devices, and the like.

Another application of the present invention is in meteorology. Man's total knowledge of atmospheric electricity comes from the study of voltage gradient and charge currents. The study of absolute atmospheric potential in relation to weather patterns and storm phenomena opens an entire new dimension of knowledge and understanding.

The prior art suggests that a time varying absolute potential would alter the nature of some of the most basic physical constants. The consequences of altering these contants involves such things as the nature of red shift to the size, shape, and age of the cosmos.

There are preliminary indications that there may be a connection between potential changes and cell splitting, membrane transport, bacterial growth rate, water uptake, electromagnetic activity, and the like. It would be no surprise to discover that life has adapted to cycles of potential variation of which our technology has been unaware. Theories about the origin and evolution of the earth's magnetic field may take on new meaning with the discovery of a measured quantity of influence capable of variation and reversal. The presence of an undetected non-zero electrical charge distribution throughout the atmosphere could increase a thousand fold the devastating effect of the electromagnetic pulse formed by extra-atmospheric thermonuclear detonation. Without the knowledge of absolute electrical potential, equations for the compression of ionospheric charges are incomplete.

The invention has been described with reference to the preferred embodiments. Obviously, modifications and alterations will occur to those of ordinary skill in the art upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. An apparatus for measuring electrical potential comprising:
   a hermetically sealed, electrically insulative enclosure encompassed within a conductive cage that fixes an amount of electrical charge contained in an interior of the cage;
   a first electrode disposed within the enclosure a fixed distance from the cage and electrically isolated from the cage for sensing electrical potential within the enclosure;
   a charge density changing means for changing the charge density within the enclosure such that the potential sensed by the first electrode changes in accordance with the charge density change; and,
   a potential measuring means operatively connected with the electrode for measuring the sensed potential change.

2. The apparatus as set forth in claim 1 further including:
   a movable barrier means which divides the interior of the enclosure into at least a first closed volume and a second closed volume, the first electrode being disposed in the first volume;
   a second electrode disposed in the second volume and electrically isolated from the cage;
   wherein the charge density changing means includes means for moving the barrier to change the size of the first and second volumes; and,
   wherein the potential measuring means is electrically connected with the first and second electrodes and includes a current measuring means for measuring current flow therethrough between the first and second electrodes.

3. The apparatus as set forth in claim 2 further including a volume change measuring means for measuring the volume changes and wherein the potential measuring means further includes means for deriving a measure of the potential from the measured current flow and the measured volume change.

4. The apparatus as set forth in claim 3 wherein the barrier means is electrically conductive and electrically connected with the cage, whereby the first and second volumes are electrically shielded from each other.

5. The apparatus as set forth in claim 3 wherein the volume change measuring means includes means for measuring the pressure in at least one of the first and second volumes.

6. The apparatus as set forth in claim 3 wherein the volume change measuring means includes means for measuring mechanical displacement of the barrier.

7. The apparatus as set forth in claim 1 wherein the charge density changing means includes a means for changing a volume defined within the enclosure, whereby contracting the volume increases and expanding the volume decreases the charge density in accordance with the volume change and initial charge density.

8. The apparatus as set forth in claim 7 further including:
   a second hermetically sealed, electrically conductive enclosure for fixing an amount of charge therein;
   a second electrically conductive cage surrounding the second enclosure;
   a second electrode disposed within the second enclosure and electrically isolated from the second cage;
   wherein the volume changing means further changes the volume within the second enclosure; and
   wherein the potential measuring means is operatively connected between the first and second electrodes and includes a current sensing means for measuring current flow between the first and second electrodes.

9. The apparatus as set forth in claim 1 wherein the first electrode is hollow and hermetically sealed.

10. The apparatus as set forth in claim 9 wherein the potential measuring means includes a current measuring means electrically connected between the first electrode and the cage for measuring current flow therebetween, whereby the measured current flow is indicative of changes in the potential of the enclosure.

11. The apparatus as set forth in claim 10 wherein the potential measuring means includes an integrating means for integrating the measured current flow for a preselected duration.

12. The apparatus as set forth in claim 10 further including an electrical resistance connected between the first and second electrodes to limit a rate of the current flow therebetween.

13. The apparatus as set forth in claim 12 wherein the current measuring means measures the voltage across the resistance.

14. An apparatus for measuring electrical potential comprising:
   a hermetically sealed, electrically insulative enclosure having a conductive cage therearound for fixing an amount of electrical charge contained in an interior thereof;
   a first electrode disposed within the enclosure and electrically isolated from the cage for sensing electrical potential within the enclosure;
   means for changing a volume of the hermetically sealed enclosure interior; and,
   a potential measuring means operatively connected with the electrode for measuring a change in the sensed potential as the volume changes.

15. The apparatus as set forth in claim 14 wherein the potential measuring means includes a current measuring means electrically connected between the first electrode and the cage for measuring current flow therebetween, whereby the measured current flow and the volume change are indicative of the potential charge.

16. The apparatus as set forth in claim 15 further including a volume change measuring means for measuring the volume change and wherein the potential measuring means further includes means for deriving a measure of the potential change from the measured current flow and the measured volume change.

17. The apparatus as set forth in claim 15 wherein the first electrode is hollow to define the changed volume therein.

18. An apparatus for measuring electrical potential comprising:
   a hermetically sealed, electrically insulative enclosure having a conductive cage therearound;
   a hollow electrode disposed within and electrically isolated from the cage;
   a current path between the cage and the electrode;
   a current measuring means for measuring current flow between the hollow electrode and the cage along the current path as the potential of the cage varies, whereby changes in the potential of the cage are measured relative to the potential of the hollow electrode.

19. An apparatus for measuring electrical potential comprising:
   a hermetically sealed, electrically insulative enclosure which defines at least one enclosed volume therein;
   an electrically conductive cage surrounding the enclosure;
   an electrode disposed within the enclosed volume;
   an enclosure volume changing means for changing the enclosed volume; and,
   a current measuring means for measuring current flow between the electrode and the cage as the enclosed volume of the enclosure is changed.

20. A method of measuring electrical potential comprising:
   changing charge density within a closed insulating enclosure that has an electrically conductive cage therearound and an electrode disposed therein;
   measuring charge transfer to and from the electrode as the charge density is changed.

21. The method as set forth in claim 20 wherein the charge density changing step includes changing the volume of the insulating enclosure and further including correlating the volume change with the charge transfer to determine potential.

22. The method as set forth in claim 21 further including changing the volume of a second enclosure in coordination with the change in the first enclosure volume and measuring current flow between electrodes disposed in the first and second enclosures.

23. A method of measuring electrical potential comprising:
   hermetically sealing a hollow electrode within a hermetically sealed, electrically insulative enclosure;
   disposing the enclosure within a Faraday cage;
   measuring current flow between the electrode and the Faraday cage as the potential of the cage varies, whereby changes in the potentials of the cage are measured relative to the fixed potential of the hollow electrode.

24. A method for measuring electrical potential comprising:
   changing the volume enclosed by a hermetically sealed, electrically insulative enclosure which is surrounded by a Faraday cage;
   measuring current flow between an electrode disposed within the insulative enclosure and the cage as the enclosed volume is changed.

* * * * *